United States Patent [19]

Dixon, Jr.

[11] Patent Number: 4,511,865

[45] Date of Patent: Apr. 16, 1985

[54] MILLIMETER WAVE SIGNAL LIMITER HAVING FERRITE LOADED SLOTS IN GROUND PLANE OF IMAGE GUIDE

[75] Inventor: Samuel Dixon, Jr., Neptune, N.J.

[73] Assignee: The United States of America as represented by the Secretary of the Army, Washington, D.C.

[21] Appl. No.: 581,833

[22] Filed: Feb. 21, 1984

[51] Int. Cl.³ .............................................. H01P 1/23
[52] U.S. Cl. ................................... 333/17 L; 333/24.1
[58] Field of Search ..................... 333/17 L, 24.1, 24.2

[56] References Cited

U.S. PATENT DOCUMENTS

| | | | |
|---|---|---|---|
| 4,218,663 | 8/1980 | Brundle et al. | 333/17 L |
| 4,342,010 | 7/1982 | Dixon, Jr. et al. | 333/17 L |
| 4,459,567 | 7/1984 | Stern et al. | 333/17 L |

*Primary Examiner*—Paul Gensler

*Attorney, Agent, or Firm*—Anthony T. Lane; Jeremiah G. Murray; Edward Goldberg

[57] ABSTRACT

A millimeter wave planar slot excited image guide ferrite power limiter comprising a length of dielectric transmission line or waveguide for millimeter wave frequencies located on a relatively thin conductive ground plane, forming thereby an image guide. The ground plane includes a plurality of selectively positioned slots along the length of the ground plane under the dielectric waveguide in which bodies of high anisotropy uniaxial barium ferrite material are placed and which collectively act as a passive ferrite power limiter when biased by an externally applied biasing magnetic field. A biasing magnetic field is provided by a pair of rare earth permanent magnets located along the sides of the image guide perpendicular to the orientation of the RF magnetic fields of the signal propagating down the dielectric waveguide. This leaves the top surface of the image dielectric guide accessible for other integrated circuit fabrication.

16 Claims, 4 Drawing Figures

MILLIMETER WAVE SIGNAL LIMITER HAVING FERRITE LOADED SLOTS IN GROUND PLANE OF IMAGE GUIDE

The invention described herein may be manufactured, used and licensed by or for the Government for governmental purposes without the payment of any royalties thereon or therefor.

CROSS REFERENCE TO RELATED APPLICATION

The application is related to U.S. Ser. No. 582,193, entitled, "Millimeter Wave Image Guide And Reject Filter", filed in the name of Samuel Dixon, Jr., the present inventor, on Feb. 21, 1984.

FIELD OF THE INVENTION

This invention relates generally to signal limiters for electrical signals and more particularly to a millimeter wave ferromagnetic power limiter.

Known millimeter wave devices for the propagation of millimeter waves typically employ a dielectric transmission medium comprising a length of high resistivity dielectric waveguide located on a conductive ground plane which forms thereby an image guide transmission line structure. Additionally, such devices normally use the top surface of the dielectric waveguide for the fabrication of passive control circuits.

Accordingly, it is an object of the present invention to provide improvement in millimeter wave devices.

It is another object of the invention to provide a millimeter wave device which embodies a power limiter.

It is a further object of the invention to provide a slot excited image guide ferrite power limiter which operates at millimeter wave frequencies.

SUMMARY

Briefly, the foregoing as well as the other objects of the invention are provided by a high resistivity dielectric transmission line or waveguide located on a conductive ground plane having a plurality of slots formed therein at predetermined spaced intervals, which slots each contain a small rectangular block of high anisotropy uniaxial barium ferrite. A biasing DC magnetic field is transversely applied across the ferrite bodies by means of a pair of rare earth permanent magnets located at the sides of the dielectric transmission line and ground plane. The DC magnetic field applied to the ferrite bodies causes magnetic moments in the ferrite material to precess at a rate determined by the strength of the biasing magnetic field whereby at a critical threshold level of power coupled to and propagating down the transmission line, spin waves are generated in the ferrite material to absorb signal energy and thus limit the power coupled out of the transmission line to the threshold level. The top surface of the dielectric transmission line is thus available for other circuitry.

DESCRIPTION OF THE PREFERRED EMBODIMENT

Shown and described herein is a millimeter wave device that utilizes slots formed in the ground plane of an image type transmission line for the fabrication of a millimeter wave ferrite power limiter wherein ferrite material is buried under a dielectric waveguide element located on the ground plane so that the top surface is accessible for other circuit means, such as an integrated circuit configuration.

Figure 1:
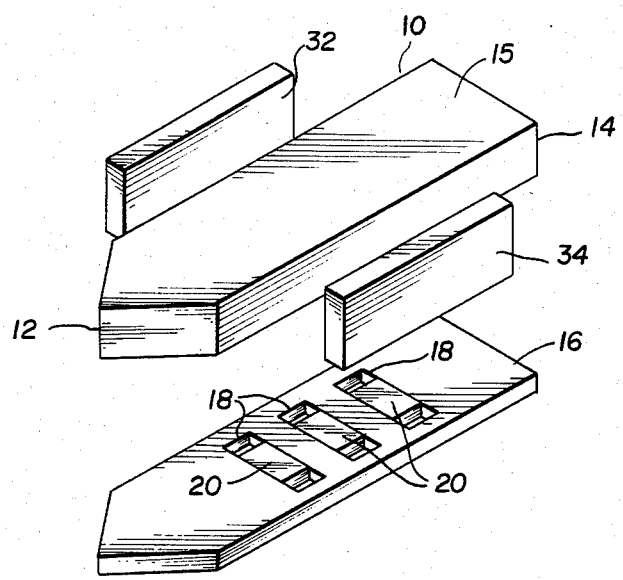
FIG. 1 is an exploded perspective view of a millimeter wave device generally illustrative of the details of the subject invention.
Figure 3:
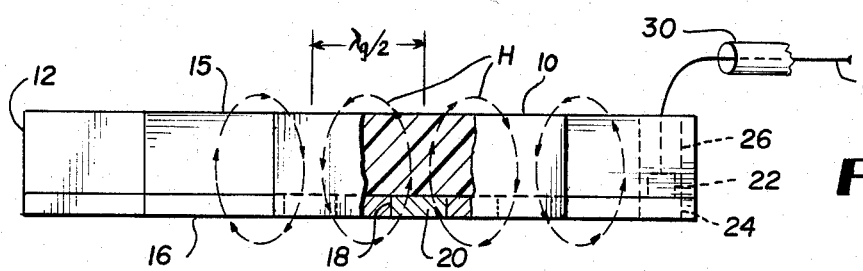
FIG. 3 is a side planar view partially cut away of the embodiment shown in FIG. 2.

Referring now to the drawings and more particularly to FIG. 1, shown therein are the primary elements of a slot excited planar ferrite power limiter. The structure as depicted is comprised of, among other things, an elongated dielectric waveguide member 10 having a generally rectangular cross section. One end 12 of the waveguide member 10, the input end, is tapered while the other end 14, the output end, includes a transverse flat face. The dielectric waveguide 10 is comprised of material having a relatively high dielectric constant and resistivity. Such material typically comprises a semiconductor group III-V compound, preferably gallium arsenide (GaAs). The dielectric waveguide member 10 is further located on a relatively thin conductive ground plane 16, being contiguous therewith as shown in FIG. 3. The ground plane 16 has a width equal to the width of the waveguide member 10 and includes a plurality of transverse rectangular slots 18, three of which are shown, which are cut entirely through the thickness of the ground plane 16. The slots 18 present a propagating medium for signal energy coupled to the input end of the image guide structure; however, the high dielectric constant of the waveguide element 10 causes the slot mode wavelength $\lambda$ to be small in comparison to the free space wavelength and therefore radiation is minimized by causing the electromagnetic fields to be closely confined to the slot areas.

The invention has for its objective the placement of individual ferromagnetic bodies 20 in slots 18. As shown, the ferromagnetic bodies are comprised of rectangular blocks and are formed of a high anisotropy uniaxial barium ferrite material which exhibits an anisotropic magnetic field $H_a$ in the order of 17,000 oersteds. The ferrite elements 20 and the separation of the slots 18 are positioned along the ground plane 16 so as to be at the half wavelength points ($\lambda_g/2$) of the RF magnetic H fields of input signal energy coupled to the input end 12 of the image guide as shown in FIG. 3 and which comprise points of high magnetic field intensity.

Figure 2:
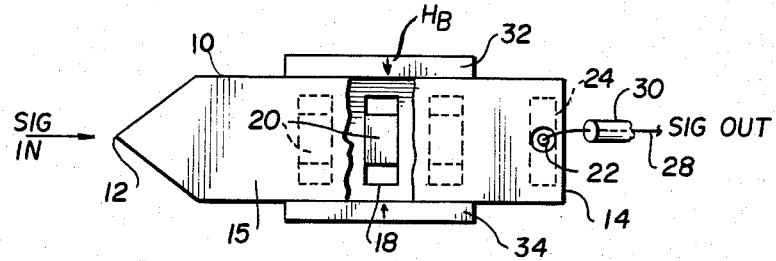
FIG. 2 is a top planar view partially cut away of the preferred embodiment of the invention.

The preferred embodiment of the invention as shown in FIGS. 2 and 3 further includes a Gunn diode 22 located at the output end 14 of the image guide structure which operates to cause substantially all of the energy to propagate in the forward direction from the tapered input end to the output end. The Gunn diode 22 is located in a separate slot 24 formed in the ground plane 16 with the dielectric waveguide element 10 also including an access opening 26 so that an output signal can be coupled from the Gunn diode 22 by way of a wire conductor 28, preferably comprising the inner conductor of a coaxial cable having an outer conductor 30.

The purpose of the ferrite elements 20 located in the slots 18 of the ground plane is to form a passive signal power limiter for the control of the amount of power coupled from the output end 14 of the image guide and the Gunn diode 22 in response to the level of the incident signal energy applied to the input end 12. Accordingly, as shown in FIGS. 2 and 3 a biasing magnetic field $H_b$ is applied transverse to the length of the image guide 10 perpendicular to the orientation of the RF magnetic fields H of the propagating signal by means of two rare earth permanent magnets 32 and 34 which are affixed to the sides of the waveguide member 10 and the ground plane 16.

At millimeter wave frequencies, the high anisotropy or built in magnetic field $H_a$ of the barium ferrite elements 20 reduces the amount of external biasing magnetic field $H_b$ required, however, due to the presence of the biasing magnetic field, the millimeter wave signal energy impinging on the ferrite material causes the magnetic moments therein to precess relative to the DC magnetic field applied at a rate determined by the strength of the magnetic field $H_b$.

Figure 4:
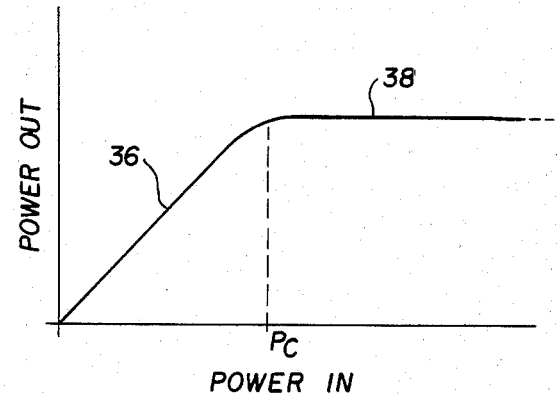
FIG. 4 is a graph illustrative of the power limiting characteristic of the invention shown in FIGS. 2 and 3.

In operation, the output power is directly proportional to the input power as shown by the inclined line portion 36 of the characteristic curve shown in FIG. 4 up to a critical threshold level of input power $P_c$. At the critical threshold power $P_c$, spin waves are generated in the ferrite material of the ferrite elements 20 causing incident signal energy to be absorbed and limit any further power output above the threshold level as evidenced by the horizontal straight line portion 38 of the characteristic curve shown in FIG. 4. Thus with the ferrite elements 20 buried in the slots 18 of the ground plane 16, the top surface 15 of the dielectric waveguide element 10 can be utilized for the fabrication of other control devices or circuitry, not shown.

While there has been shown and described what is at present considered to be the preferred embodiment of the invention, it is to be noted that the same has been made by way of illustration and not of limitation. Accordingly, all modifications, alterations and changes coming within the spirit and scope of the invention as set forth in the appended claims are herein meant to be included.

I claim:

1. A slot excited millimeter wave power limiter, comprising:
   dielectric transmission line means having a relatively high dielectric constant;
   a conductive ground plane on which said dielectric transmission line means is located forming thereby an image guide;
   said ground plane further including a plurality of slots of a predetermined area formed therein to provide a further propagating medium for energy propagating along said image guide, the dielectric constant of said transmission means causing the slot mode wavelength to be small compared to the free space wavelength, thereby causing fields to be confined substantially to the area of said slots;
   a body of ferromagnetic material located in each of said slots and having a biasing magnetic field applied thereto for causing magnetic moments in said ferromagnetic material to precess at a rate determined by the strength of said magnetic field whereby at a critical threshold level of incident signal power on said image guide, spin waves are generated in said ferromagnetic material to absorb signal energy and thus limit the power out of said image guide above said threshold level; and
   magnetic field means located in relative close proximity to said body of ferromagnetic material for providing said biasing magnetic field.

2. The power limiter as defined by claim 1 wherein said plurality of slots are equally spaced along the length of said ground plane.

3. The power limiter as defined by claim 1 wherein the respective bodies of ferromagnetic material are positioned in said slots so as to be located at the half wavelength points of the H field distribution of millimeter wave energy propagating along said image guide.

4. The power limiter as defined by claim 1 wherein said conductive ground plane is of a lesser thickness than said dielectric transmission line means.

5. The power limiter as defined by claim 1 wherein said ground plane comprises a relatively thin conductive ground plane in relation to said dielectric transmission line means.

6. The power limiter as defined by claim 1 wherein said plurality of slots run substantially transverse to the length of said ground plane.

7. The power limiter as defined by claim 6 wherein said slots are generally rectangular in shape with the longer dimension being transverse to the length of said ground plane.

8. The power limiter as defined by claim 7 wherein the shorter dimension of said rectangular slots correspond to the length of the respective body of ferromagnetic material located therein and wherein the spacing between said slots and the respective body of ferromagnetic material corresponds to half wavelength points of the signal energy propagating along said image guide.

9. The power limiter as defined by claim 1 wherein said ferromagnetic material comprises barium ferrite material.

10. The power limiter as defined by claim 1 wherein said ferromagnetic material comprises relatively high anisotropy uniaxial barium ferrite material.

11. The power limiter as defined by claim 1 wherein said dielectric transmission line means comprises a group III-V compound.

12. The power limiter as defined by claim 11 wherein said compound is comprised of gallium arsenide.

13. The power limiter as defined by claim 1 wherein said magnetic field means comprises a pair of permanent magnet elements located along the side of said image guide adjacent said bodies of ferromagnetic material located in said plurality of slots.

14. The power limiter as defined by claim 13 wherein said pair of permanent magnets are comprised of rare earth magnets.

15. The power limiter as defined by claim 1 and additionally including a semiconductor diode located at one end of said image guide for causing substantially all of the energy to propagate unidirectionally along said image guide.

16. The power limiter as defined by claim 15 wherein said diode comprises a Gunn diode located at the output end of said image guide.

* * * * *